(12) United States Patent
Noguchi

(10) Patent No.: US 6,600,176 B2
(45) Date of Patent: *Jul. 29, 2003

(54) SEMICONDUCTOR DEVICE WITH PROTECTIVE ELEMENT

(75) Inventor: Ko Noguchi, Tokyo (JP)

(73) Assignee: NEC Electronics Corporation, Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/351,134

(22) Filed: Jul. 12, 1999

(65) Prior Publication Data

US 2002/0040997 A1 Apr. 11, 2002

(30) Foreign Application Priority Data

Jul. 13, 1998 (JP) .............................. 10-197087

(51) Int. Cl.[7] .............................. H01L 29/72
(52) U.S. Cl. ...................... 257/173; 257/360
(58) Field of Search ................ 257/390, 315, 257/322, 355, 360, 173, 328; 438/309

(56) References Cited

U.S. PATENT DOCUMENTS

| | | | | | |
|---|---|---|---|---|---|
| 4,803,536 A | * | 2/1989 | Tuan | ...................... | 357/23.13 |
| 4,821,096 A | * | 4/1989 | Maloney | ................... | 357/23.13 |
| 4,829,350 A | * | 5/1989 | Miller | ..................... | 357/23.13 |
| 5,502,317 A | * | 3/1996 | Duvvury | .................... | 257/107 |
| 5,543,649 A | * | 8/1996 | Kim et al. | ................... | 257/355 |
| 5,760,445 A | * | 6/1998 | Diaz | .......................... | 257/356 |
| 5,834,802 A | * | 11/1998 | Takahashi et al. | .......... | 257/280 |
| 5,874,763 A | * | 2/1999 | Ham | .......................... | 257/360 |
| 6,091,114 A | * | 7/2000 | Mogul et al. | ................ | 257/360 |
| 6,157,065 A | * | 12/2000 | Huang et al. | ................ | 257/355 |
| 6,258,702 B1 | * | 7/2001 | Nakagawa et al. | ......... | 438/570 |
| 6,335,148 B2 | * | 1/2002 | Lee et al. | .................... | 430/316 |

FOREIGN PATENT DOCUMENTS

KR   8-181284   7/1996

* cited by examiner

Primary Examiner—Tom Thomas
Assistant Examiner—Douglas W. Owens
(74) Attorney, Agent, or Firm—McGinn & Gibb, PLLC

(57) ABSTRACT

A semiconductor device having a metal oxide semiconductor (MOS) transistor with a gate dielectric film, a gate electrode formed on the gate dielectric film, and source/drain regions formed in a semiconductor substrate. A protective element with a protected electrode overlays of the semiconductor substrate with an intervention of a dielectric film. At least one diffused region is adjacent to the protective electrode in the semiconductor substrate. The protect dielectric is connected to the electrode of the MOS transistor.

21 Claims, 5 Drawing Sheets

SEMICONDUCTOR DEVICE WITH PROTECTIVE ELEMENT

BACKGROUND OF THE INVENTION (a) Field of the Invention

The present invention relates to a semiconductor device, more in particular to the semiconductor device which is protected from deterioration or damage of a gate dielectric film due to charging of a MOS transistor in a plasma process.

(b) Description of the Related Art

A plasma process is employed in manufacture of the most semiconductors. However, the plasma process induces problems of reducing a non-defective rate of LSIs and of lowering a reliability of the LSIs because the plasma process produces damage to a gate dielectric film of a MOS device.

In FIG. 1 which illustrates an N-channel MOS transistor, a gate electrode 16 is formed on a gate dielectric film in a semiconductor substrate region surrounded by a field oxide film overlaying a P-type substrate. N-type diffused regions 15A and 15B are formed adjacent to the gate electrode 16. A metal layer 20 is formed for the gate electrode 16 and the N-type diffused regions 15A and 15B. Specifically, a metal line 20A is connected to the gate electrode 16 through gate electrode pad 19, and metal lines 20B and 20C are connected to the N-type diffused regions 15A and 15B, respectively. When plasma-etching is conducted to the metal layer 20 by employing a photoresist as a mask, charges are provided from the plasma to the gate electrode 16 through the side surface of the metal line 20, and the gate dielectric film is deteriorated.

The term "antenna ratio" is generally employed as an index for discussing the damage produced by the plasma. The area of the gate dielectric film of the MOS transistor, or the area of the gate electrode 16 overlapped with the diffused regions 15A and 15B is defined as Ag, and the peripheral length of the metal line 20A connected to the gate electrode 16 is defined as Am. The charges provided from the plasma to the portion Am are concentrated to the portion Ag. Accordingly, the ratio Am/Ag indicates a density of the charge provided to the gate dielectric film, and the damage becomes larger with the increase of this antenna ratio.

The peripheral length of the metal line 20A is employed as a numerator of the above antenna ratio. When considering, for example, the damage by the plasma during formation of an interlayer dielectric film on the metal line by means of a plasma CVD method, a sum of the surface area and of the side area of the metal line may be employed because the upper surface and the side surface of the metal line are exposed.

When the metal line is employed as a pad for bonding, the antenna ratio becomes relatively large because the area of the pad having a side length of 50 to 100 micrometers is relatively large. When the metal line is employed in an integrated circuit, the antenna ratio becomes large, and the plasma produces a serious damage because the length of the metal line may become several millimeters.

In order to avert the charging of the gate electrode already mentioned, a structure shown in FIGS. 2A and 2B is proposed.

FIG. 2A is a top plan view of an improved structure of a MOS transistor and FIG. 2B is a side view of the MOS transistor of FIG. 2A.

The metal line 20A adjacent to a gate electrode 16 is connected to a protective electrode 17 through a connection line 20D. The gate electrode 16, the P-type substrate 11 underneath, and the gate dielectric film inbetween form a MOS capacitor. The area of the MOS capacitor is the same as that of a diffused region 13, which is defined as Ac. During the etching of the metal line 20A, the metal line 20A is connected to both of the gate electrode 16 and the protective electrode 17. Therefore, the antenna ratio is Am/(Ag+Ac). Since this value is smaller than the antenna ratio Am/Ag of FIG. 1, the amount of the charge provided to the gate dielectric film can be reduced. It is especially effective that Ac is made to be sufficiently larger than Ag. The area of the connection line 20D is out of consideration because it is usually small.

However, the following problems are included in the above prior art.

When the polarity of the charging by the plasma is negative, electrons flow from the gate electrode to the substrate through the gate dielectric film. Accordingly, the reduction of the damage by the plasma can be expected even by the prior art.

When, on the other hand, the polarity of the charging by the plasma is positive, electrons flow from the substrate to the gate electrode. Since the surface of the P-type substrate 11 under the MOS capacitance is depleted and the electron density is low, only little current flows through the gate dielectric film. Since the MOS capacitor does not function as a protective element, most of the charges are concentrated to the gate dielectric film of the MOS transistor, and thus the gate dielectric film is damaged.

SUMMARY OF THE INVENTION

It is therefore an object of the present invention, in view of the above, to provide a semiconductor device which is protected from deterioration or damage of a gate dielectric film due to charging of a MOS transistor, for example, under a process employing plasma.

The present invention provides, in a first aspect thereof, a semiconductor device comprising: a MOS transistor having a gate dielectric film, a gate electrode formed on said gate dielectric film, and source/drain regions formed in a semiconductor substrate of a first conductivity-type; a protective element having a protective electrode overlaying said semiconductor substrate with an intervention of a dielectric film, and at least one diffused region adjacent to said protective electrode in said semiconductor substrate; said protective electrode being connected to said gate electrode of said MOS transistor.

In a second aspect of the present invention, two diffused regions of opposite polarities are employed in place of the diffused region of the first aspect, and one of the two diffused regions is adjacent to the electrode and the other diffused region is adjacent to the above diffused region.

In a third aspect of the present invention, the two diffused regions of opposite polarities of the second aspect are connected by a connection wire.

In a fourth aspect of the present invention, both of the two diffused regions are adjacent to the electrode.

In accordance with the present invention, the amount of the current or charge flown though the gate dielectric film is reduced, and thus the damage to the gate dielectric film is reduced.

Moreover, the present invention is effective in either case when the polarity of the charging by the plasma is positive or negative.

The above and other objects, features and advantages of the present invention will be more apparent from the following description.

PREFERRED EMBODIMENTS OF THE INVENTION

Now, the present invention is more specifically described with reference to accompanying drawings.

Figure 1:
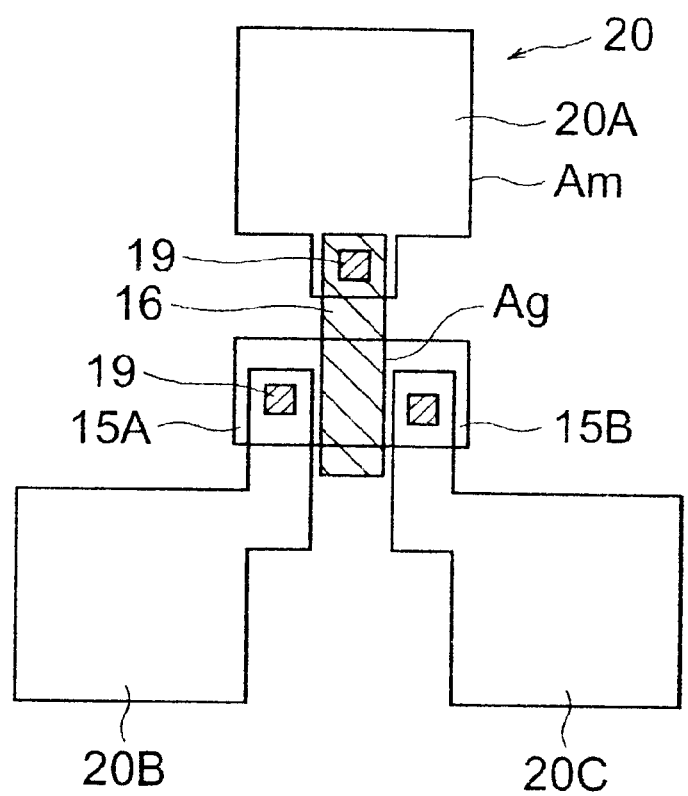
FIG. 1 is a top plan view of a conventional MOS transistor.

At first, the principle of the present invention will be described. The description of the same elements as those of FIGS. 1 to 2B will be hereinafter omitted by attaching the same numerals thereto.

Figure 3A:
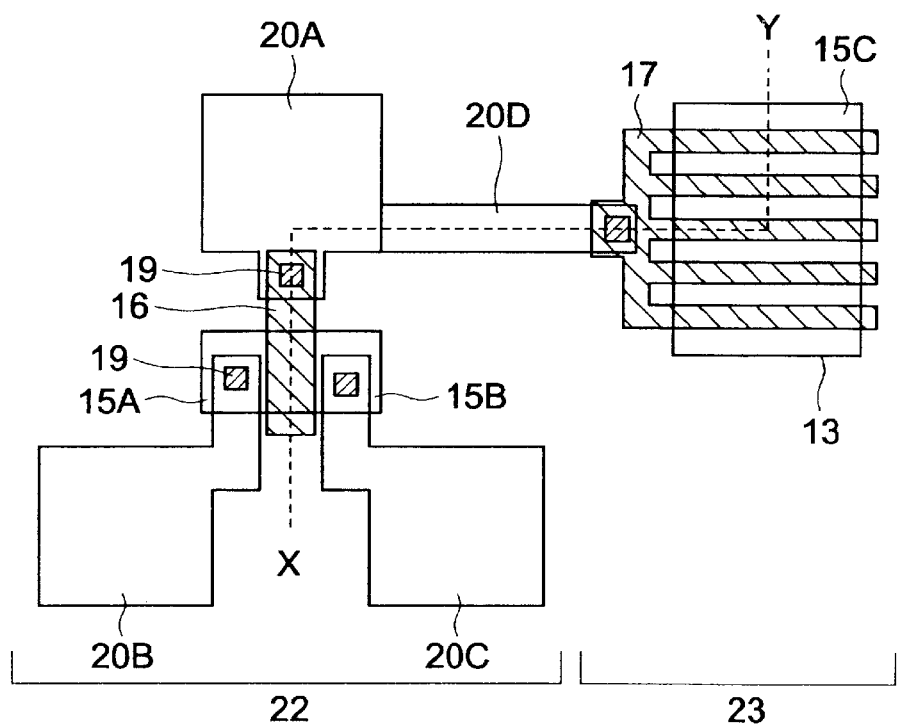
FIG. 3A is a top plan view of one embodiment of a MOS transistor in accordance with the present invention.
Figure 3B:
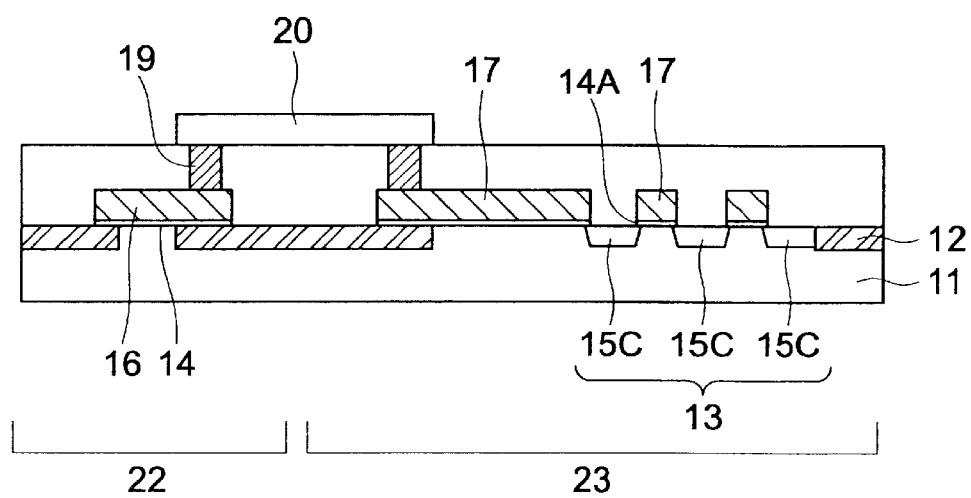
FIG. 3B is a sectional view of the MOS transistor of FIG. 3A taken along a line X-Y.

In FIGS. 3A and 3B, a semiconductor device essentially consists of a MOS transistor 22 and a protective element 23. The MOS transistor 22 includes a gate electrode 16, N-channel diffused regions 15A and 15B and a metal layer 20. The protective element 23 has a gate electrode 17 formed on a diffused region 13. The gate electrode 16 of the MOS transistor 22 and the protective electrode 17 of the protective element 23 are connected with each other by a connection line 20D. Since a charge generated in a metal line 20A during a plasma process is separately provided to the gate electrode 16 and to the protective electrode 17, the amount of the charge provided to the gate electrode 16 of the MOS transistor 22 can be reduced, and thus the damage to the MOS transistor is reduced.

In order to effectively bypass the charge to the gate dielectric film of the protective element, the protective electrode of the protective element has either of the following characteristics (1) or (2).

(1) Having a comb-like shape including a plurality of narrow lines, and an N-type diffused region adjacent thereto.
(2) Having a rectangular or comb-like shape and an N-type diffused region electrically connected to a P-type diffused region, The N-type diffused region adjacent to the gate electrode functions as a source of carriers (electrons), which effectively provides a tunnel current to the gate dielectric film.

Figure 2A:
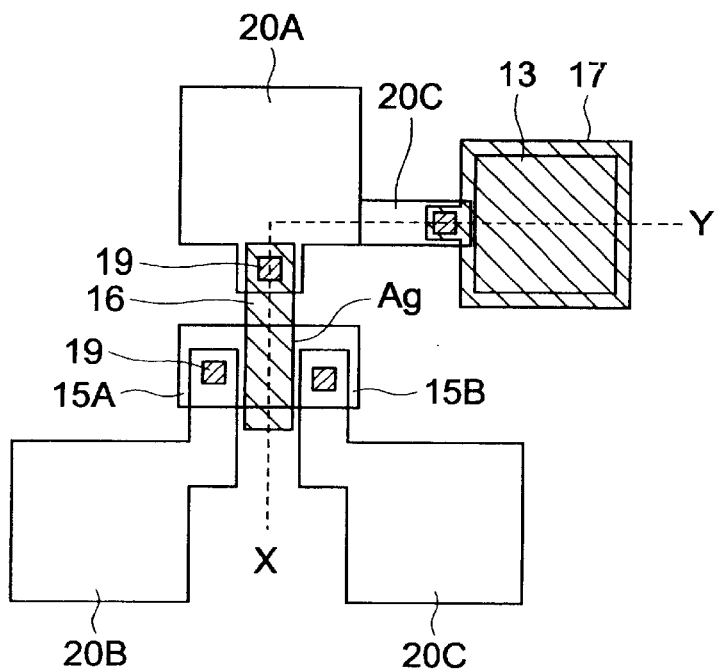
FIG. 2A is a top plan view of another conventional MOS transistor.
Figure 2B:
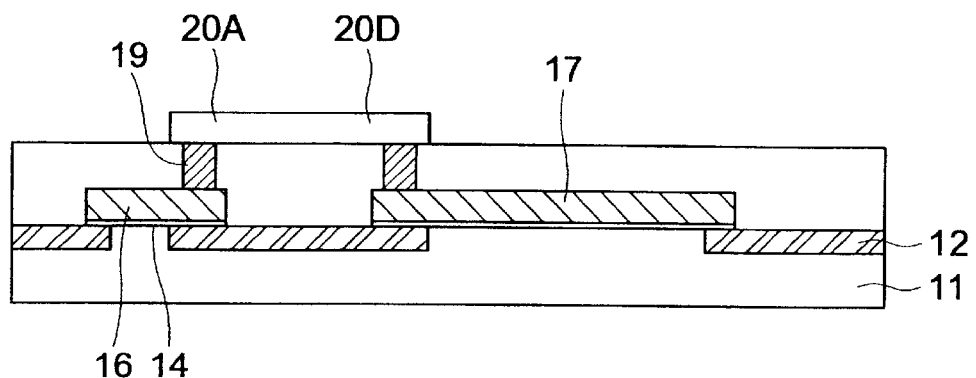
FIG. 2B is a sectional view of the MOS transistor of FIG. 2A taken along a line X-Y.

In a first embodiment of the present invention shown in FIGS. 3A and 3B, the MOS transistor 22 has the same structure as that of the conventional one of FIGS. 2A and 2B. The metal line 20A functioning as an electrode pad is connected to the protective element 23 by way of the connection line 20D.

The diffused region 13 of the protective element 23 is located in a region surrounded by a field dielectric film 12 overlaying the P-type substrate 11. The protective electrode 17 is formed on the diffused region 13, and is composed of a plurality of linear elements each having a uniform shape and a width of about 1 micrometer or less arranged in a comb-like shape. The diffused region 13 adjacent to the protective electrode 17 includes a plurality of N-type diffused regions 15C.

If light emitted by the plasma irradiates the diffused region of such a semiconductor device during a plasma process, electrons and holes functioning as carriers are produced in a depleted layer at a boundary between the diffused region and the substrate. When the polarity of the charging during the plasma process is positive, the electrons produced by the light in the depleted layer of the N-type diffused region 15C act as a supply source of the carrier flowing to the gate dielectric film. Such a supply source of the carrier is necessary for reducing the damage of the gate dielectric film. In this embodiment, the protective element effectively reduces the damage depending on the area of the protective element.

The antenna ratio in the semiconductor device of FIGS. 3A and 3B is Am/(Ag+Ac) in which the peripheral length of the metal line is defined as Am, the area of the gate dielectric film 14 of the gate electrode 16 is defined as Ag, and area of the gate dielectric film 14A of the protective electrode 17 is defined as Ac. The damage may be remarkably reduced by increasing Ac, because the antenna ratio is decreased The amount of the carriers produced by light is determined by the area and the peripheral length of the diffused region. In this embodiment, the peripheral length in contact with the diffused region 13 is made longer to increase the total amount of the carrier by making the shape of the protective electrode 17 comb-like.

The damage of the gate dielectric film 14 can be reduced by decreasing the amount of the charge, which can be achieved by making the protective electrode of the protective element 23 share the most part of the accumulated charges in the gate electrode 16 of the MOS transistor 22.

As shown in FIG. 3B, the diffused regions 15C may be located at both the lower sides of the protective electrode 17. Or the protective electrode 17 may cover the whole diffused region designated by a numeral 13 of FIGS. 3A and 3B.

Figure 4A:
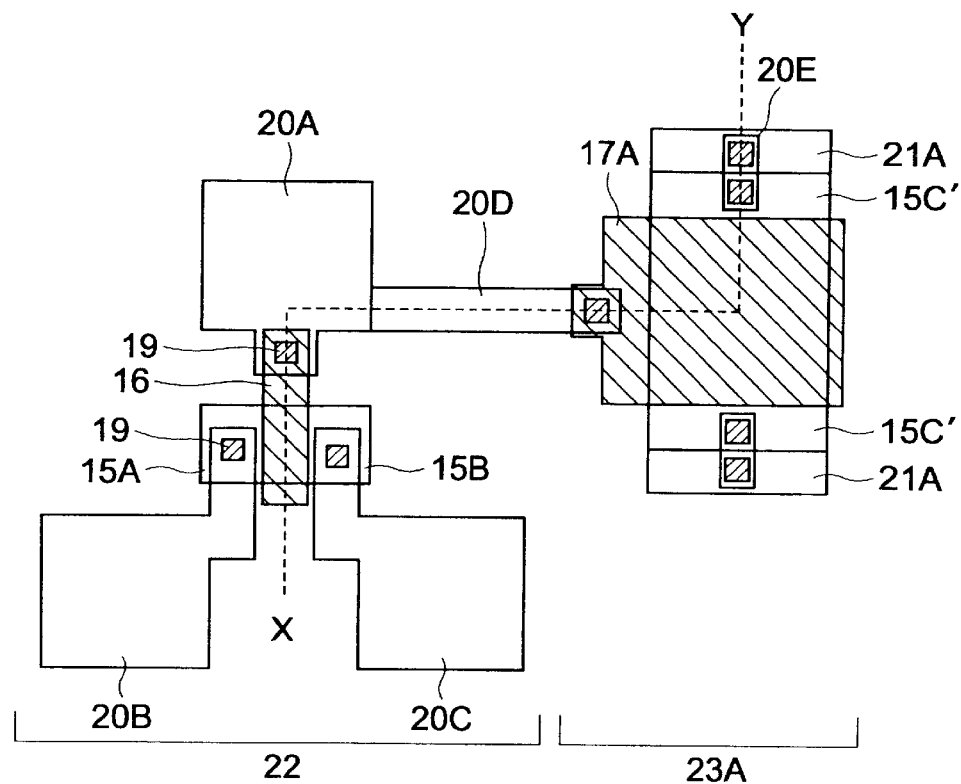
FIG. 4A is a top plan view of another embodiment of a MOS transistor in accordance with the present invention.
Figure 4B:
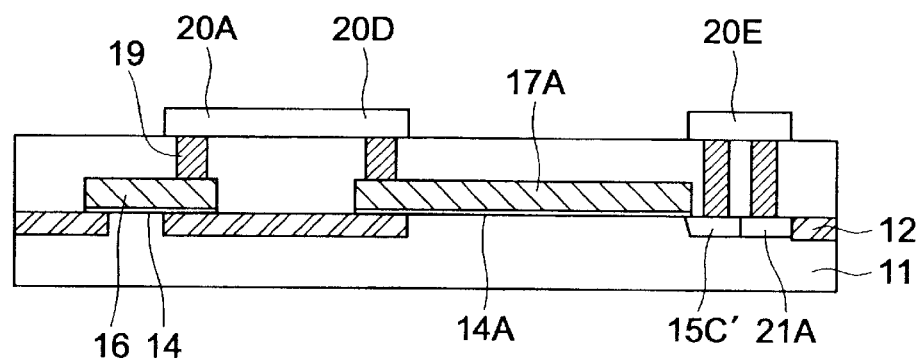
FIG. 4B is a sectional view of the MOS transistor of FIG. 4A taken along a line X-Y.

In FIGS. 4A and 4B showing a second embodiment of the present invention, the difference from the first embodiment is that the protective electrode 17A of the protective element 23A is formed as one rectangular shape, and an N-type diffused region 15C' is formed adjacent to the protective electrode 17A and a P-type diffused region 21A is formed adjacent thereto. Since a current flows in the gate dielectric film 14A of the protective element 23A, existence of carriers is required on the surface of the substrate. In this embodiment, the carrier on the substrate flows into the N-type diffused region 15C' through the P-type diffused region 21A. The P-type diffused region 21A and the N-type diffused region 15C' are short-circuited by a conductive element 20E. Since a specified amount of current is flown between the P-type diffused region 21A and the N-type diffused region 15C' by means of a tunneling phenomenon if both of the impurity concentrations of the P-type diffused region 21A and the N-type diffused region 15C' are about $5 \times 10^{19}$ cm$^{-3}$ or more, the P-type diffused region 21A and the N-type diffused region 15C' may not be short-circuited by the conductive element 20E. The N-type diffused region 15C' can be kept apart from the P-type diffused region 21A if the P-type diffused region 21A and the N-type diffused region 15C' are short-circuited by the conductive element 20E. Since, in either case, the carrier is supplied from the P-type substrate 11 to the region under the gate electrode 17A through the N-type diffused region 15C', the shape of the protective electrode 17A is not restricted to the comb-like one, and may be a rectangular shape.

When the P-type diffused region 21A and the N-type a diffused region 15C' are short-circuited by the conductive element 20E, the P-type diffused region 21A and the N-type diffused region 15C' may not be in contact with each other and may be separated from each other.

Figure 5:
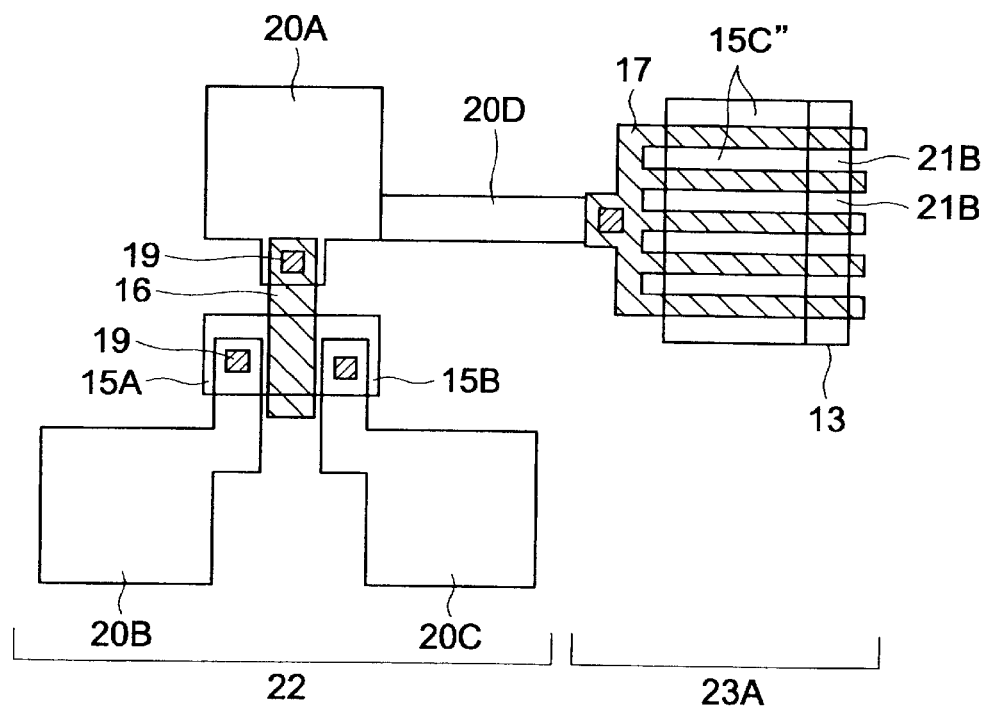
FIG. 5 is a top plan view of a further embodiment of a MOS transistor in accordance with the present invention.

In FIG. 5 showing a third embodiment of the present invention, a protective element 23 has the same comb-like shape as that of the first embodiment, and a P-type diffused region 21B and an N-type diffused region 15C" are formed in contact with a protective electrode 17. Although the P-type diffused region 21B and the N-type diffused region 15C" are in contact with each other in FIG. 5, they may be separated and short-circuited.

The diffused regions 21B and 15C" may be located along the both sides of the electrode 17 as shown in FIG. 3B. Or the region designated by the numeral 13 in FIG. 5 may be made a rectangular diffused region so that the diffused regions 15C" and 21B also exist beneath the electrode 17.

The MOS transistors of the above embodiments may be employed as an inspection transistor having a gate electrode pad and is not restricted thereto.

Since a similar charging problem arises even in an ordinary MOS transistor employed in an integrated circuit if a long wiring is connected to an electrode, the charging of the electrode can be prevented by applying the present invention.

Although only the case in which the semiconductor substrate is the P-type one has been described, an N-type semiconductor substrate can be also employed. However, in this case, the N-type diffused region and the P-type diffused region are replaced with a P-type diffused region and an N-type diffused region, respectively.

Since the above embodiments are described only for examples, the present invention is not limited to the above embodiments and various modifications or alternations can be easily made therefrom by those skilled in the art without departing from the scope of the present invention.

What is claimed is:

1. A semiconductor device comprising:
    a metal oxide semiconductor (MOS) transistor having a gate dielectric film, a gate electrode formed on said gate dielectric film, and source/drain regions formed in a semiconductor substrate of a first conductivity type;
    a protective element having a comb-like protective electrode overlaying said semiconductor substrate with an intervention of a dielectric film, and a plurality of diffused regions, at least one diffused region being adjacent to said protective electrode,
    wherein said comb-like protective electrode comprises a plurality of linear elements each having a uniform shape and is connected to said gate electrode of said MOS transistor, and
    wherein said plurality of diffused regions comprises:
        a first diffused region having a second conductivity-type adjacent to said protective electrode; and
        a second diffused region having a first conductivity-type; and
    a conductive element which connects said first diffused region and said second diffused region.

2. The semiconductor device as defined in claim 1, wherein said first diffused region is a source of carriers for providing a tunnel current to said dielectric film of said protective element.

3. A semiconductor device comprising:
    a metal oxide semiconductor (MOS) transistor having a gate dielectric film, a gate electrode formed on said gate dielectric film, and source/drain regions formed in a semiconductor substrate of a first conductivity type; and
    a protective element having a protective electrode overlaying said semiconductor substrate with an intervention of a dielectric film, and at least one diffused region adjacent to said protective electrode in said semiconductor substrate,
    wherein said protective electrode is connected to said gate electrode of said MOS transistor,
    wherein said diffused region comprises a first diffused region of a second conductivity-type and a second diffused region of a first-conductivity type, and said first diffused region is adjacent to said protective electrode and said second diffused region is adjacent to said first diffused region, and
    wherein said first and second diffused regions are connected together by a connection wire.

4. The semiconductor device as defined in claim 1, wherein the first diffused region is a source of carriers for providing a tunnel current to said dielectric film of said protective.

5. The semiconductor device as defined in claim 1, wherein said linear elements have a width of less than about 1 micrometer.

6. The semiconductor device as defined in claim 1, wherein said comb-like protective electrode has a predetermined peripheral length so as to control an amount of carrier supplied to gate dielectric film of said protective element.

7. The semiconductor device as defined in claim 1, wherein said plurality of diffused regions are formed underneath said protective electrode.

8. The semiconductor device as defined in claim 1, wherein said plurality of diffused regions are interspaced with said linear elements.

9. A semiconductor device comprising:
    a semiconductor substrate;
    a MOS transistor having a gate electrode;
    a protective element having a comb-like protective electrode overlaying said semiconductor substrate, and a plurality of diffused regions, at least one diffused region being adjacent to said protective electrode;
    wherein said comb-like protective electrode comprises a plurality of linear elements each having a uniform shape and is connected to said gate electrode of said MOS transistor, and
    wherein said plurality of diffused regions comprises:
        a first diffused region having a second conductivity-type adjacent to said protective electrode; and
        a second diffused region having a first conductivity-type; and
    a conductive element which connects said first diffused region and said second diffused region.

10. The semiconductor of claim 9 further comprising a dielectric film disposed between said protective electrode and said semiconductor substrate.

11. The semiconductor device as defined in claim 9, wherein said first diffused region is a source of carriers for providing a tunnel current to said dielectric film of said protective element.

12. The semiconductor device as defined in claim 9, wherein said first diffused region comprises a plurality of second conductivity type diffused regions.

13. A semiconductor device comprising:
    a semiconductor substrate;
    a MOS transistor having a gate dielectric film and a gate electrode formed on said gate dielectric film;
    a protective element having a protective electrode overlaying the semiconductor substrate with an intervention of a dielectric film, and a plurality of diffused regions, at least one diffused region being adjacent to said protective electrode;

wherein said protective electrode is connected to said gate electrode of said MOS transistor, and wherein said plurality of diffused regions comprises:
- a second conductivity-type diffused region adjacent to said protective electrode; and
- a first conductivity type diffused region electrically connected to said second conductivity-type diffused region; and
- a conductive element which connects said first conductivity-type diffused region and said second conductivity-type diffused region.

14. The semiconductor device as defined in claim 13, wherein said conductive element comprises a conductive wire.

15. A semiconductor device comprising:

a semiconductor substrate;

a MOS transistor having a gate dielectric film and a gate electrode formed on said gate dielectric film; and a protective element having a protective electrode overlaying the semiconductor substrate with an intervention of a dielectric film, and at least one diffused region adjacent to said protective electrode in said semiconductor substrate, wherein said protective electrode is connected to said gate electrode of said MOS transistor, wherein said diffused region includes a first diffused region of a second conductivity-type and a second diffused region of a first conductivity-type, and said first diffused region is adjacent to said protective electrode and said second diffused region is adjacent to said first diffused region, and wherein said first and second diffused regions are connected together by a connection wire.

16. The semiconductor device as defined in claim 13, wherein said second conductivity-type diffused region and said first conductivity-type diffused region are short-circuited.

17. The semiconductor device as defined in claim 13, wherein a shape of said protective electrode is rectangular.

18. The semiconductor device as defined in claim 13, wherein said conductive element is formed in a same plane as said gate electrode of said MOS transistor.

19. The semiconductor device as defined in claim 13, wherein said conductive element is formed in a same plane as a metal line connecting said protective electrode and said gate electrode of said MOS transistor.

20. The semiconductor device as defined in claim 13, wherein said first conductivity-type diffused region and said second conductivity-type diffused region have impurity concentrations of at least about $5 \times 10^{19}$ cm$^{-3}$.

21. The semiconductor device as defined in claim 1, wherein said protective element substantially prevents a charge concentration on said gate electrode of said MOS transistor during a plasma discharge.

* * * * *